(12) United States Patent
Pyo

(10) Patent No.: US 6,468,907 B2
(45) Date of Patent: Oct. 22, 2002

(54) METHOD OF MANUFACTURING A COPPER WIRING IN A SEMICONDUCTOR DEVICE

(75) Inventor: Sung Gyu Pyo, Kyungki-do (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 0 days.

(21) Appl. No.: 09/880,816

(22) Filed: Jun. 15, 2001

(65) Prior Publication Data

US 2002/0031912 A1 Mar. 14, 2002

(30) Foreign Application Priority Data

Jun. 15, 2000 (KR) .......................................... 00-32921

(51) Int. Cl.[7] .............................................. H01L 21/44
(52) U.S. Cl. ...................... 438/687; 438/622; 438/625; 438/680; 438/745
(58) Field of Search ................................ 438/687, 680, 438/681, 622–629, 637–638, 692, 743, 747, 748, 754

(56) References Cited

U.S. PATENT DOCUMENTS

2001/0019891 A1 * 9/2001 Koh et al. ................... 438/687
2002/0031911 A1 * 3/2002 Pyo ............................. 438/687
2002/0048949 A1 * 4/2002 Pyo ............................. 438/687

OTHER PUBLICATIONS

Park et al. "Superfilling CVD of Copper using a Catalytic Surfactant", Interconnect Technology Conference 2001, Proceedings IEEE 2001 International, Jun. 4, 2001, pp 12–14.*

* cited by examiner

Primary Examiner—Tuan H. Nguyen
Assistant Examiner—Thanhha Pham
(74) Attorney, Agent, or Firm—Finnegan, Henderson, Farabow, Garrett, & Dunner, L.L.P.

(57) ABSTRACT

There is disclosed a method of manufacturing a copper wiring in a semiconductor device that overcomes the limitation of copper filling into a contact hole and a trench formed on an insulating film, by first forming a chemical enhancer layer, performing immersion wet cleaning and warm annealing processes so that the chemical enhancer layer can be remained only at the contact hole and the bottom portion of the trench, performing a MOCVD method using a copper precursor and then filling the contact hole and the trench by a self-aligned copper growth method for growing copper within the selected contact hole and the trench thus realizing reappearance of copper deposition process and also obtaining a thin copper film of a good film quality.

28 Claims, 2 Drawing Sheets

METHOD OF MANUFACTURING A COPPER WIRING IN A SEMICONDUCTOR DEVICE

BACKGROUND OF THE INVENTION

1. Field of the Invention

The invention relates generally to a method of manufacturing a copper wiring in a semiconductor device. More particularly, the present invention relates to a method of manufacturing a copper wiring in a semiconductor device capable of not only realizing reappearance of copper deposition process but also obtaining a thin copper film of a good film quality, by establishing the technology of metal organic chemical vapor deposition (MOCVD) process using 1,1,1, 5,5,5-hexafluoro-2,4-pentadionato (3,3-dimethyl-1-butene)-copper(I) (hereinafter called "(hfac)Cu(DMB)" compound as a copper precursor.

2. Description of the Prior Art

As the semiconductor industry has moved toward ultra large-scale integration (ULSI), the geometry of devices has been continuously reduced to a sub-half-micron area while the circuit density in view of improvement of performance and reliability has increased. In order to meet these needs, in forming a metal wiring in a semiconductor device, a thin copper film can increase reliability of a semiconductor device due to a high electro-migration (EM) in copper film since it has a higher melting point than aluminum. Also, thin copper film can increase the signal transfer speed due to its low resistivity. Therefore, thin copper film has been employed as a useful interconnection material for integrated circuits.

In a method of manufacturing a copper wiring, a copper deposition process is useful for realizing higher-speed devices and higher-integration devices. The process employs various deposition methods such as a physical vapor deposition (PVD) method, an electroplating method, an electroless-plating method, a metal organic chemical vapor deposition (MOCVD) method. Of these copper deposition technologies, as the copper deposition by MOCVD method is significantly affected by a copper precursor, a copper precursor must be developed which can be easily deposited. Also, a delivery system capable of safely carrying this copper precursor must be necessarily developed.

Copper deposition by MOCVD method may employ a liquid delivery system (hereinafter called "LDS") of a bubbler scheme, an LDS, such as a direct liquid injection (hereinafter called "DLI") or an LDS, such as a control evaporation mixer (hereinafter called "CEM"). In addition, it may employ various LDSs, such as an LDS having a vaporizer of an orifice scheme or a spray scheme. Copper is deposited by dissolving compounds including a copper metal called a precursor in these LDSs. The copper precursor for use in MOCVD includes $Cu^{II}$ compounds, such as a 1,1,1,5, 5,5 hexafluoro-2,4-pentadionato-copper(II);Cu (hfac)2 compounds having a low vapor pressure. After that, $Cu^I$ compounds have been developed which have a faster deposition speed due to high vapor pressure, compared to $Cu^{II}$ compounds, thus allowing a thin copper film of a high purity to be deposited at low temperatures of 150 to 250° C.

Among $Cu^I$ compounds developed so far, 1,1,1, 5,5,5-hexafluoro-2, 4-pentadionato (trimethylvinylsilane)-copper (I) (hereinafter called "(hfac)Cu(TMVS)") is a representative copper precursor for use in MOCVD. The compound is widely used since it exists at the liquid state at room temperature and allows a thin copper film of high purity to be deposited at a low temperature.

Even with these advantages, however, the (hfac)Cu (TMVS) compound has a problem in that it is degraded at high temperature and there is a difficulty in reappearance of the process when used in the process of manufacturing semiconductor devices. Also, though the vapor pressure of the (hfac)Cu(TMVS) compound is high among various precursors developed so far, it is rather low in securing appearance in a conventional LDS. Thus, there is a problem in securing reappearance as far as a new LDS capable of safely delivering a precursor. In addition, the (hfac)Cu (TMVS) has a problem that it must be kept at constant temperature since the difference between its vaporization temperature and its condensation temperature is narrow.

In order to solve problems associated with (hfac)Cu (TMVS), (hfac)Cu(DMB) has been developed as a precursor. (hfac)Cu(DMB) is a new compound which has been developed using 3,3-dimethyl-1-butene (hereinafter called "DMB") as a Lewis base ligand. Since the DBM, having a low molecular weight and a high vapor pressure, is used as a Lewis base ligand instead of methyl group of TMVS, it has a higher vapor pressure than (hfac)Cu(TMVS). Therefore, the (hfac)Cu(DMB) compound is the most advantageous precursor since it can significantly improve a low deposition speed, which is one of the greatest problems in the MOCVD Cu precursor. However, the technology of MOCVD process using a (hfac)Cu(DMB) has not been established in a conventional LDS, nor commercialized.

SUMMARY OF THE INVENTION

The present invention provides a method of manufacturing a copper wiring in a semiconductor device capable of not only realizing reappearance of a copper deposition process but also obtaining a thin copper film having good film quality, by forming a chemical enhancer layer at the contact hole and the bottom of the trench and then selectively forming copper, using the technology of metal organic chemical vapor deposition (MOCVD) process using (hfac) Cu(DMB) compound as a copper precursor, without developing a new LDS.

A method of manufacturing a copper wiring in a semiconductor device according to the present invention comprises the steps of, after patterning a given region of an interlayer insulating film formed on a semiconductor substrate to form a damascene pattern, performing a cleaning process; forming a diffusion prevention film on the entire structure including the damascene pattern; forming a chemical enhancer layer on the surface of the diffusion prevention film; removing the chemical enhancer on the remaining portions except for the bottom portion of the damascene pattern, by performing immersion wet cleaning process and warm annealing process; forming a copper layer so that the damascene pattern can be filled; and polishing the copper layer to form a copper wiring.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in de tail by way of a preferred embodiment with reference to accompanying drawings.

Figure 1A:
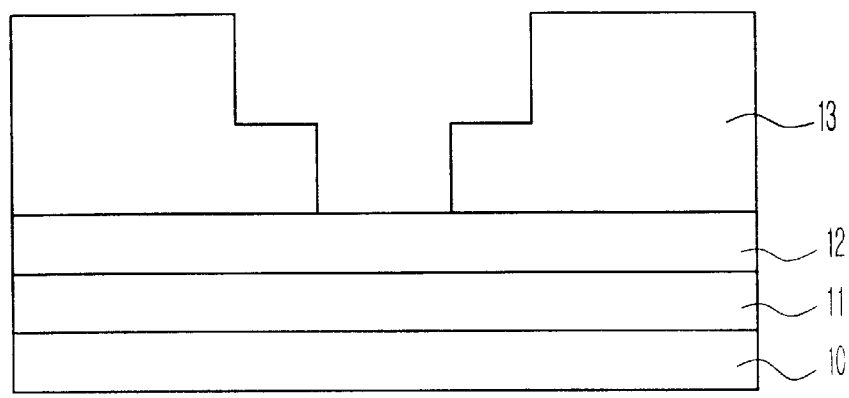
FIGS. 1a~1f are cross-sectional views for illustrating a method of manufacturing a copper wiring in a semiconductor device according to the present invention.

Referring now to FIG. 1a, a first insulating film 11, a first metal layer 12 and an interlayer insulating film 13 are sequentially formed on a semiconductor substrate 10 in which various components for forming a semiconductor device are formed. After a damascene pattern, consisting of a contact hole and a trench, is formed at the interlayer insulating film 13, a cleaning process is performed.

The interlayer insulating film 13 is formed using an insulating material having a low dielectric constant. The damascene pattern formed at the interlayer insulating film 13 is formed in a dual damascene pattern. The cleaning process employs RF plasma if the first metal layer 12 is W and Al, etc. If the first metal layer 12 is Cu, the cleaning process employs a reactive cleaning method.

Figure 1B:
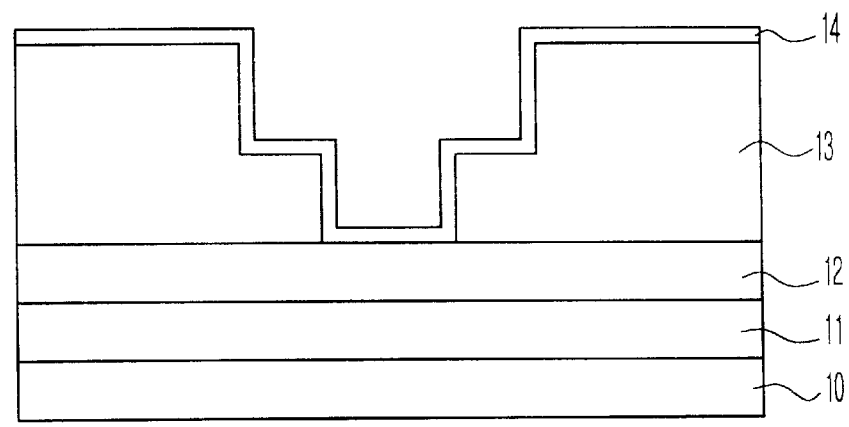

Referring now to FIG. 1b, a diffusion prevention film 14 is formed on the entire structure including the sidewalls of the damascene pattern.

The diffusion prevention film 14 is formed of at least one of ionized PVD TiN, CVD TiN, MOCVD TiN, ionized PVD Ta, ionized PVD TaN, CVD Ta, CVD TaN, CVD WN, CVD TiAlN, CVD TiSiN and CVD.

Figure 1C:
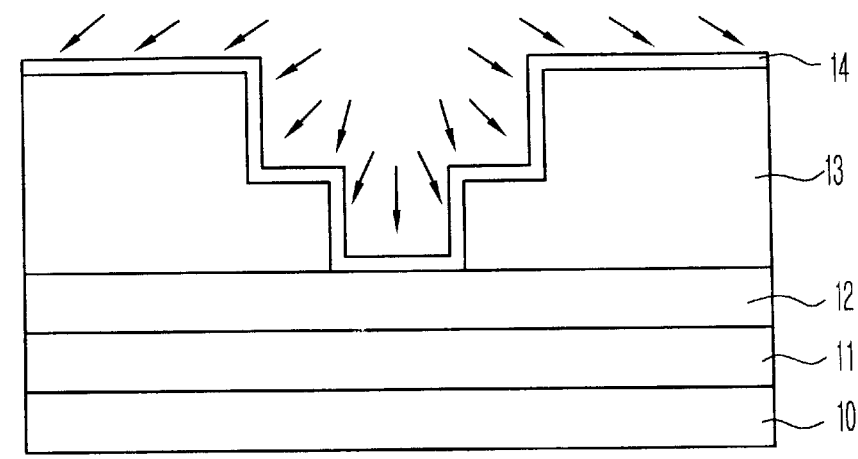

Referring now to FIG. 1c, a chemical enhancer layer 15 is formed on the entire structure including the trench and the contact hole.

The chemical enhancer layer 15 is formed by chemically enhanced chemical vapor deposition (CECVD) using one of iodine (I)-containing liquid compound, Hhfacil/$2H_2O$, Hhfac, TMVS, pure $I_2$, iodine (I)-containing gas and water vapor as a catalyst, or using F, Cl, Br, I and At in a gaseous state or a liquid state which are group-7 elements in the periodical table.

The CECVD process is performed for 1 to 600 seconds in the MOCVD equipment including a liquid delivery system (LDS) capable of delivering catalysts and their compounds in a liquid and gaseous state. As the CECVD process is performed at the temperature of between –20 and 300° C., the MOCVD equipment also performs the process at the temperature of between –20 to 300° C.

Figure 1D:
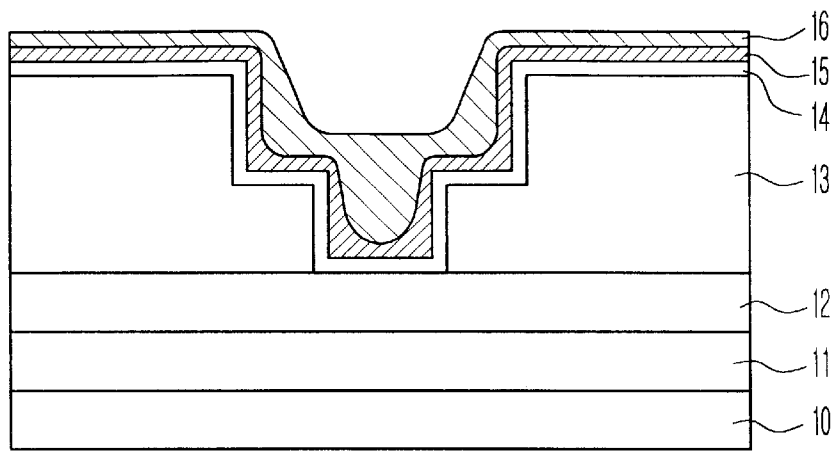

Referring now to FIG. 1d, after the chemical enhancer layer 15 is formed, in order to easily remove the chemical enhancer layer 15, immersion wet cleaning is performed using cleaning solution 16. Then, by performing warm annealing, the chemical enhancer layer 15 is removed from the surface of the interlayer insulating film 13 and remains only at the bottom portion of the damascene pattern.

The immersion wet cleaning is performed for 1 second to 5 minutes using any one of pure water (Dl), Dl+$H_2SO_4$, BOE and Dl+HF as a cleaning solution. Also the immerse wet cleaning is performed at a temperature of between –20 and 50° C., using a spin rinsing method by which the semiconductor substrate 10 is immersed into the cleaning solution and is then rotated in the range of between 1 and 300 rpm. After the immerse wet cleaning process is performed, a warm annealing process is performed in order to remove any remaining cleaning solution 16. The warm annealing process is also performed at a temperature of between room temperature and 200° C. while rotating the semiconductor substrate 10 at the rate of 1 and 200 rpm in order to easily remove the any remaining cleaning solution 16.

Figure 1E:
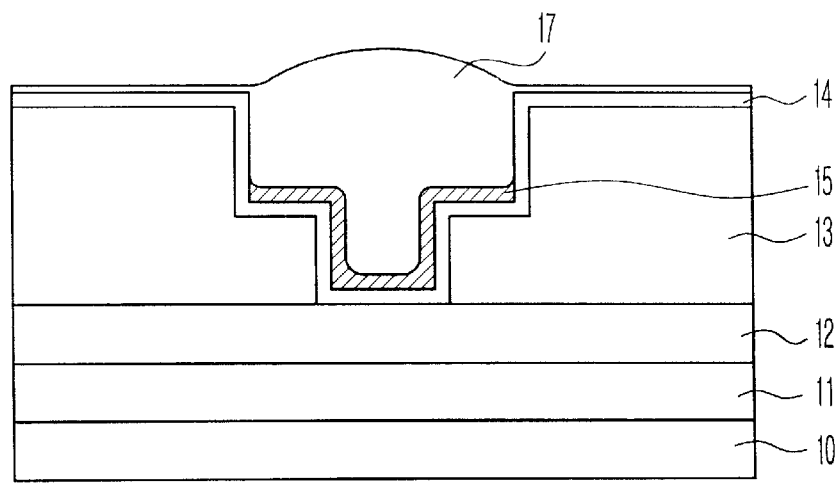

Referring now to FIG. 1e, the internal portion of the damascene pattern is filled with Cu layer 17 by self-aligned growth process using MOCVD. This process easily fills the internal portion of the damascene pattern with Cu since deposition of Cu is concentrated on the portion at which chemical enhancer such as iodine, etc. used in the process shown in FIG. 1d is concentrated. Filling of Cu can be applied to all kinds of vaporizers such as DLI, CEM, orifice scheme and spray scheme, by use of all kinds of Cu precursors using hfac such as (hfac)CuV(TMOS) series, (hfac)Cu(DMB) series and (hfac)Cu(TMVS) series, etc. Cu is deposited using MOCVD using them.

In the above process, carrier gases employs any one of He, $H_2$ and Ar and the flow amount is in the range of between 100 and 700 sccm. At this time, the pressure within the reaction chamber is in the range of 0.5 and 5 Torr. The deposition temperature is in the range of between 50 and 300° C. and the distance between the showerhead within the copper deposition apparatus (not shown) and the susceptor plate is between 5 and 50 mm. In addition, the flow rate of the (hfac)Cu(DMB) compound, being a Cu precursor, is in the range of between 0.1 and 5.0 sccm. After the chemical enhancer is formed, aluminum or tungsten may be filled instead of copper.

Figure 1F:
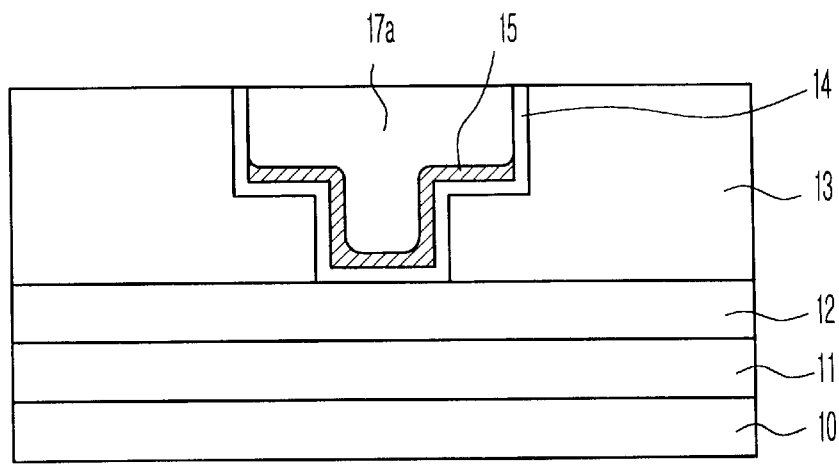

Referring now to FIG. 1f, after copper is filled by MOCVD process, hydrogen reduction annealing process and chemical mechanical polishing (CMP) process are sequentially performed to remove the copper layer 17 remaining on the surface of the interlayer insulating film 13 and the diffusion prevention film 14 except for the internal portion of the damascene pattern, thus forming a copper wiring 17a.

The hydrogen reduction annealing process is performed under hydrogen reduction atmosphere at a temperature between room temperature and 450° C. for 1 minute to 3 minutes, thus changing a grain morphology. At this time, the hydrogen reduction atmosphere may use hydrogen ($H_2$) only or hydrogen mixture gas such as $H_2$+Ar(1–95%), $H_2$+$N_2$ (1–95%), etc. After CMP process is performed, a pre-cleaning may be performed. The cleaning process and the process of forming a diffusion barrier may be performed with no time delay. Also, the copper plating process and hydrogen reduction annealing process may be performed with no time delay.

As mentioned above, the present invention facilitates filling of Cu into the dual damascene pattern even in the ultra-fine structure, by forming a chemical enhancer layer only in a contact hole and at the bottom of a trench by immersion wet cleaning process and warm annealing process and by growing copper by self-aligned growth process using MOCVD method. Therefore, the present invention has advantages that it can not only realize reappearance of copper deposition process but also obtain a thin copper film of a good film quality.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a copper wiring in a semiconductor device, comprising the steps of:

forming a damascene pattern by patterning a given region of an interlayer insulating film formed on a semiconductor substrate;

performing a cleaning process on the damascene pattern;

forming a diffusion prevention film on the substrate including said damascene pattern;

forming a chemical enhancer layer on a surface of said diffusion prevention film;

removing said chemical enhancer layer on remaining portions except for a bottom portion of said damascene pattern, by performing a wet cleaning process and an annealing process;

forming a copper layer so that said damascene pattern can be filled; and polishing said copper layer to form a copper wiring.

2. The method of manufacturing a copper wiring in a semiconductor device according to claim 1, wherein said damascene pattern is formed in a dual damascene.

3. The method of manufacturing a copper wiring in a semiconductor device according to claim 1, wherein said interlayer insulating film is formed using an insulating material having a low dielectric constant.

4. The method of manufacturing a copper wiring in a semiconductor device according to claim 1, wherein the cleaning process performed on the damascene pattern, which exposes an underlying layer of W or Al, is performed using RF plasma.

5. The method of manufacturing a copper wiring in a semiconductor device according to claim 1, wherein the cleaning process performed on the damascene pattern, which exposes an underlying layer of Cu, is performed using a reactive cleaning process.

6. The method of manufacturing a copper wiring in a semiconductor device according to claim 1, wherein said diffusion prevention film is formed of one of ionized physical vapor deposition (PVD) TiN, chemical vapor deposition (CVD) TiN, metal organic chemical vapor deposition (MOCVD) TiN, ionized PVD Ta, ionized PVD TaN, CVD Ta, CVD TaN, CVD WN, CVD TiAlN, CVD TiSiN, and CVD TaSiN.

7. The method of manufacturing a copper wiring in a semiconductor device according to claim 1, wherein said chemical enhancer layer is formed by chemical enhanced chemical vapor deposition (CECVD) method for between 1 and 600 seconds.

8. The method of manufacturing a copper wiring in a semiconductor device according to claim 7, wherein said CECVD method uses one of iodine-containing liquid compound, $H(hfac)1/2H_2O$, H(hfac) and TMVS as a catalyst.

9. The method of manufacturing a copper wiring in a semiconductor device according to claim 7, wherein said CECVD method uses one of pure $I_2$, iodine-containing gas and water vapor as a catalyst.

10. The method of manufacturing a copper wiring in a semiconductor device according to claim 7, wherein said CECVD method uses F, Cl, Br, I and At in a gaseous state, or F, Cl, Br, I and At in a liquid state as a catalyst.

11. The method of manufacturing a copper wiring in a semiconductor device according to claim 7, wherein said CECVD method is performed in metal organic chemical vapor deposition (MOCVD) equipment including a liquid delivery system (LDS) for delivering compounds with F, Cl, Br, I and At in a gaseous state and compounds with F, Cl, Br, I and At in a liquid state.

12. The method of manufacturing a copper wiring in a semiconductor device according to claim 7, wherein said CECVD method is performed at a temperature of −20 to 300° C.

13. The method of manufacturing a copper wiring in a semiconductor device according to claim 1, wherein said wet cleaning process is an immersion wet cleaning process performed using any one of pure water (Dl), $Dl+H_2SO_4$, BOE and Dl+HF as a cleaning solution.

14. The method of manufacturing a copper wiring in a semiconductor device according to claim 1, wherein said wet cleaning process is an immersion wet cleaning process performed for between 1 and 300 seconds.

15. The method of manufacturing a copper wiring in a semiconductor device according to claim 1, wherein said wet cleaning process is an immersion wet cleaning process performed at a temperature of between −20 and 50° C.

16. The method of manufacturing a copper wiring in a semiconductor device according to claim 1, wherein said wet cleaning process is an immersion wet cleaning process performed while rotating a wafer at a rotation range of between 1 and 3000 rpm.

17. The method of manufacturing a copper wiring in a semiconductor device according to claim 1, wherein said annealing process is performed at a temperature of 200° C.

18. The method of manufacturing a copper wiring in a semiconductor device according to claim 1, wherein said annealing process is performed while rotating a wafer at a rotation range of between 1 and 2000 rpm.

19. The method of manufacturing a copper wiring in a semiconductor device according to claim 1, wherein said copper layer is formed using any one of precursors of (hfac)Cu(VTMOS) series, (hfac)Cu(DMB) series and (hfac)Cu(TMVS) series.

20. The method of manufacturing a copper wiring in a semiconductor device according to claim 19, wherein said flow rate of said precursor is in the range of between 0.1 to 1.0 sccm.

21. The method of manufacturing a copper wiring in a semiconductor device according to claim 1, wherein said copper layer is formed by self-aligned growth process, and wherein said self-aligned growth process is performed by metal organic chemical vapor deposition (MOCVD) method in a copper deposition apparatus including a vaporizer having one of direct liquid injection (DLI), control evaporation mixer (CEM), an orifice scheme and a spray scheme.

22. The method of manufacturing a copper wiring in a semiconductor device according to claim 21, wherein said MOCVD method uses any one of He, $H_2$ and Ar as a carrier gas.

23. The method of manufacturing a copper wiring in a semiconductor device according to claim 22, wherein a flow amount of the carrier gas is in the range of 100 and 700 sccm.

24. The method of manufacturing a copper wiring in a semiconductor device according to claim 21, wherein an internal pressure of said copper deposition apparatus is in the range of between 0.5 and 5 Torr.

25. The method of manufacturing a copper wiring in a semiconductor device according to claim 21, wherein said self-aligned growth process is performed at a temperature of between 50 and 300° C.

26. The method of manufacturing a copper wiring in a semiconductor device according to claim 21, wherein a distance between a showerhead and a susceptor plate in the copper deposition apparatus is between 5 and 50 mm.

27. The method of manufacturing a copper wiring in a semiconductor device according to claim 1, wherein, after said copper formation, a hydrogen reduction annealing process is performed with no time delay and wherein said hydrogen reduction annealing process is performed under hydrogen reduction atmosphere at a temperature of between room temperature and 450° C., and between 1 minutes to 3 minutes.

28. The method of manufacturing a copper wiring in a semiconductor device according to claim 27, wherein said hydrogen reduction atmosphere use any one of hydrogen ($H_2$), $H_2+Ar(1-95\%)$ and $H_2+N_2(1-95\%)$.

* * * * *

UNITED STATES PATENT AND TRADEMARK OFFICE
CERTIFICATE OF CORRECTION

PATENT NO. : 6,468,907 B2 Page 1 of 1
DATED : October 22, 2002
INVENTOR(S) : Sung Gyu Pyo It is certified that error appears in the above-identified patent and that said Letters Patent is hereby corrected as shown below:

Column 5,
Line 32, "TIA1N" should read -- TiAlN --.
Line 64, "(Dl), Dl+H$_2$SO$_4$," should read -- (DI), DI+H$_2$SO$_4$, --.
Line 65, "Dl+HF" should read -- DI+HF --.

Column 6,
Line 35, "onifice" should read -- orifice --.

Signed and Sealed this

Sixteenth Day of March, 2004

JON W. DUDAS
*Acting Director of the United States Patent and Trademark Office*